United States Patent [19]

Sachitano et al.

[11] Patent Number: 4,902,640
[45] Date of Patent: Feb. 20, 1990

[54] HIGH SPEED DOUBLE POLYCIDE BIPOLAR/CMOS INTEGRATED CIRCUIT PROCESS

[75] Inventors: Jack Sachitano, Portland, Oreg.; Hee K. Park, Seoul, Rep. of Korea; Paul K. Boyer, Beaverton, Oreg.; Gregory C. Eiden, Madison, Wis.; Tadanori Yamaguchi, Hillsboro, Oreg.

[73] Assignee: Tektronix, Inc., Beaverton, Oreg.

[21] Appl. No.: 87,176

[22] Filed: Aug. 19, 1987

Related U.S. Application Data

[63] Continuation of Ser. No. 40,447, Apr. 17, 1987, Pat. No. 4,826,782.

[51] Int. Cl.$^4$ ............... H01L 21/70; H01L 27/00
[52] U.S. Cl. ....................... 437/57; 437/162; 437/31; 437/33; 437/193; 437/233; 148/DIG. 9; 148/DIG. 124; 156/643; 357/43; 357/59
[58] Field of Search ............... 437/57, 41, 44, 59, 437/31, 32, 33, 162, 233, 191, 193, 195; 148/DIG. 9, DIG. 10, DIG. 124, DIG. 151; 357/43, 59 H, 34; 156/643

[56] References Cited

U.S. PATENT DOCUMENTS

| | | | |
|---|---|---|---|
| 4,072,545 | 2/1978 | De La Moneda | 437/41 |
| 4,157,269 | 6/1979 | Ning et al. | 437/33 |
| 4,325,169 | 4/1982 | Ponder et al. | 437/27 |
| 4,346,512 | 8/1982 | Liang et al. | 437/56 |
| 4,381,953 | 5/1983 | Ho et al. | 437/31 |
| 4,431,460 | 2/1984 | Barson et al. | 437/31 |
| 4,471,522 | 9/1984 | Jambotkar | 437/162 |
| 4,483,726 | 11/1984 | Isaac et al. | 437/31 |
| 4,495,010 | 1/1985 | Kranzer | 437/162 |

(List continued on next page.)

OTHER PUBLICATIONS

Isaac et al., "Advanced Bipolar Technology for High Performance VLSI", VLSI Science and Technololgy/1982 Proceedings, vol. 82-7, pp. 298-305.
Higashisaka et al., "Sidewall Assisted Closely Spaced Electrode Technology for High Speed GaAs LSIs", Ext. Abs. of the 15th Conf. on Solid State Devices and Matls., Tokyo, 1983, pp. 69-72.

(List continued on next page.)

Primary Examiner—Brian E. Hearn
Assistant Examiner—M. Wilczewski
Attorney, Agent, or Firm—John D. Winkelman; Alexander C. Johnson, Jr.

[57] ABSTRACT

A mixed bipolar-CMOS self-aligned process and integrated circuit provide a high performance NPN bipolar transistor in parallel to fabrication of a PMOSFET and an NMOSFET. Gate and base contacts are formed in a first polysilicon layer. The base contacts are implanted with P+ ion concentrations for diffusing base contact regions of the substrate in a later drive-in step. Source and drain contacts and emitter contacts are formed in a second polysilicon layer. The source and drain contacts are formed as a unit and then separated into discrete contacts by a spin-on polymer planarization and etch-back procedure. Lightly-doped lateral margins of the source, drain and base regions are ion-implanted in an initial low concentration (e.g. about $10^{13}$ atoms/cm$^2$). The gate and base contact structures serve as a mask to self-align the implants. Then, the gate and base structures are enclosed in an oxide box having sidewalls. The second polysilicon layer, next deposited, is laterally spaced by the sidewalls from the first layer. The second layer is selectively implanted with dopant ions of appropriate type for each device: N-type for the NMOSFET and P-type for the PMOSFET and the base of an NPN bipolar transistor. A drive-in step diffuses the implanted ions into the substrate. A shallow P+ intrinsic base is formed, which is spaced from the P+ base contact diffusions by a lightly-doped margin. Then, the emitter contact polysilicon is implanted N+ and a drive-in step forms a shallow emitter within the P+ base. The FET device likewise have graduated doping profiles in their source and drain diffusions.

43 Claims, 4 Drawing Sheets

U.S. PATENT DOCUMENTS

| | | | |
|---|---|---|---|
| 4,507,171 | 3/1985 | Bhatia et al. | 437/162 |
| 4,507,853 | 4/1985 | McDavid | 437/187 |
| 4,581,319 | 4/1986 | Wieder et al. | 437/162 |
| 4,707,456 | 11/1987 | Thomas et al. | 357/43 |
| 4,727,046 | 2/1988 | Tuntasood et al. | 437/31 |
| 4,734,382 | 3/1988 | Krishna | 437/47 |
| 4,735,911 | 4/1988 | Schaber | 437/41 |
| 4,735,916 | 4/1988 | Homma et al. | 437/162 |
| 4,737,472 | 4/1988 | Schaber et al. | 148/DIG. 9 |
| 4,752,589 | 6/1988 | Schaber | 357/43 |
| 4,784,971 | 11/1988 | Chiu et al. | 437/57 |
| 4,808,548 | 2/1989 | Thomas et al. | 437/57 |

OTHER PUBLICATIONS

Cole, B. C., "Mixed-Process Chips are About to Hit the Big Time," Electronics, Mar. 3, 1986, pp. 27–31.

"A Bipolar Process That's Repelling CMOS," Electronics, Dec. 23, 1985, pp. 45–47.

Miyamoto et al., J., "A 28nd CMOS SRAM with Bipolar Sense Amplifiers," 1984 IEEE National Solid-State Circuits Conference Digest of Technical Papers, pp. 224–225, 344 (1984).

Brown, et al., D. M., "Trends in Advanced Process Technology—Submicrometer CMOS Device Design and Process Requirements," Proc. IEEE, vol. 74, No. 12, pp. 1678–1702, Dec. 1986, at p. 1694.

Ogiue et al., K., "13-ns, 500-mW, 64-MW, 64-kbit ECL RAM Using Hl-BICMOS Technology," IEEE Journal of Solid-State Circuits, vol. SC-21, No. 5, pp. 681–685, Oct. 1986.

Ning et al., T., "Bipolar Trends," Proc. IEEE, vol. 74, No. 12, pp. 1669–1677, Dec. 1986.

Konaka, S., "A 30 ps Si Bipolar IC Using Super Self-Aligned Process Technology," Extended Abstracts 16th Conference on Solid State Devices and Materials, pp. 209–212 (1984).

Suzuki et al., M. "A 9-GHz Frequency Divider Using Si Bipolar Super Self-Aligned Process Technology," IEEE Electron Device Letters, vol. EDL-6, No. 4, pp. 181–183 (Apr. 1985).

Huang, et al., T. Y., "A MOS Transistor with Self-Aligned Polysilicon Source-Drain," IEEE Electron Device Letters, vol. EDL-7, No. 5, May 1986, pp. 314–316.

Oh, C. S. and Kim, C. K., "A New MOSFET Structure with Self-Aligned Polysilicon Source and Drain Electrodes", IEEE Electron Device Letters, vol. EDL-5, 1984, pp. 400–402.

Wong et al., S. S., "Elevated Source/Drain MOSFET," IEDM Tech. Dig., 1984, pp. 634–637.

Chu, et al., S. F., "A Self-Aligned Bipolar Transistor," VLSI Science and Technology/1982 Proceedings, vol. 82-7, pp. 306–314.

Barson, et al., F., "Shallow Bipolar Transistor Profiles by Diffusion from Implanted Polysilicon," VLSI Science and Technology/1982 Proceedings, vol. 82-7, pp. 282–287.

Wong, S. S., "Contact Technologies for Submicron CMOS," Cornell Program on Submicrometer Structures, 1985.

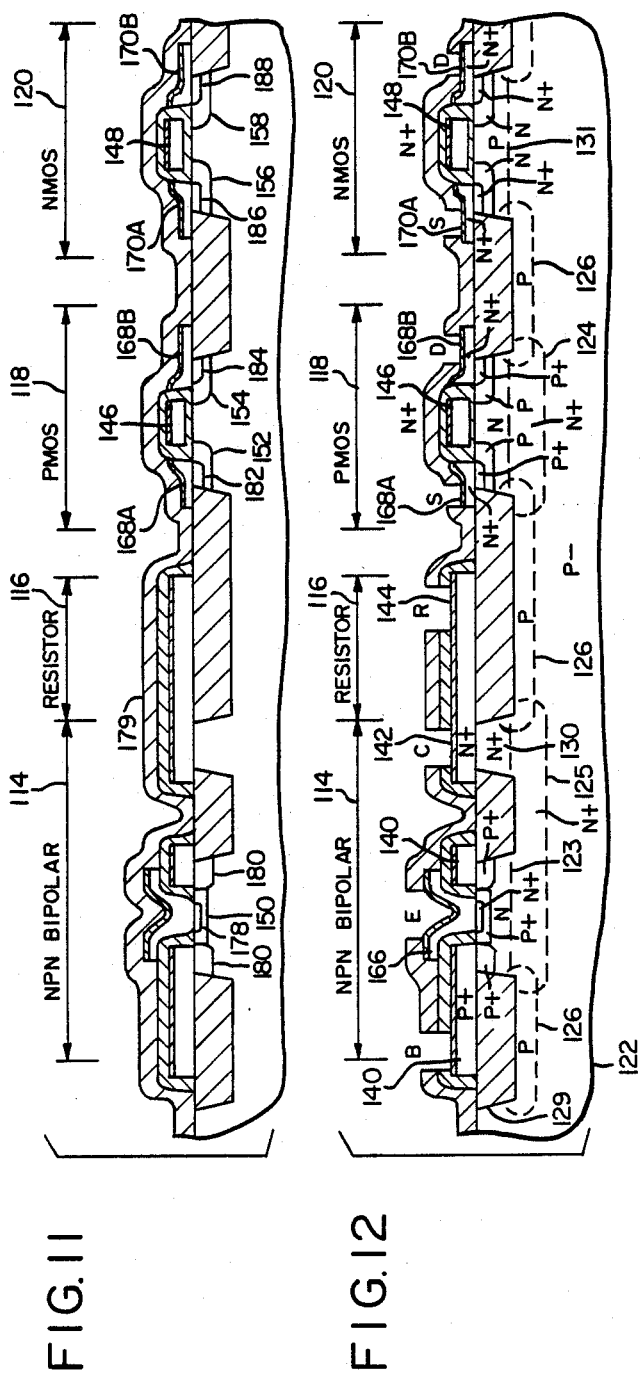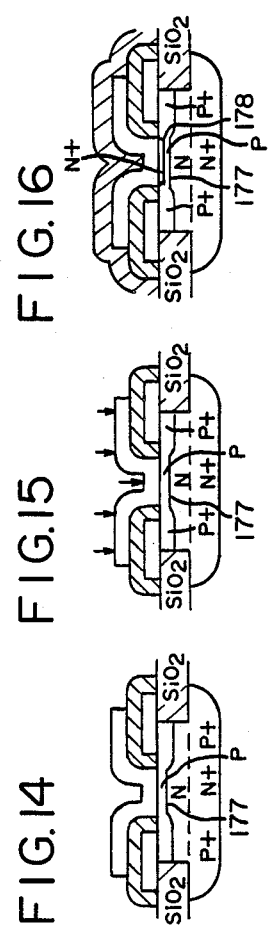

HIGH SPEED DOUBLE POLYCIDE BIPOLAR/CMOS INTEGRATED CIRCUIT PROCESS

This application is a continuation of patent application Ser. No. 040,447, entitled METHOD OF FABRICATING A FIELD-EFFECT TRANSISTOR, filed on Apr. 17, 1987, now U.S. Pat. No. 4,826,782, issued May 2, 1989.

BACKGROUND OF THE INVENTION

This invention relates to a mixed bipolar-MOS process for fabricating both bipolar and field effect transistors on a common integrated circuit chip.

Chip makers have long known that mixed bipolar-MOS processes, referred to in the art as BiMOS and BiCMOS, can produce faster and denser integrated circuits than can either technology alone. However, it has taken a long time to master the complex processing that these integrated circuits required. The advantages of mixed bipolar-MOS have been apparent since the early 1970's. At that time, however, bipolar and MOS structures required entirely different techniques and tools to fabricate. To design a mixed process device meant considerable expense. The present invention is a process technology that makes it very easy to fabricate mixed bipolar MOS devices in a common integrated circuit, obtaining the advantages of both bipolar and MOS processes and devices without significant additional expense.

Several integrated circuit manufacturers have been investigating methods of merging or mixing bipolar and MOS structures on the same chip and have disclosed or marketed BiMOS or BiCMOS devices. A summary of developments in this area of technology is presented in B. C. Cole, "Mixed-Process Chips Are About To Hit The Big Time," Electronics, Mar. 3, 1986, pages 27–31. This article discloses the wide range of processes that designers are trying in attempting to make satisfactory hybrid bipolar-MOS processes. Most begin with essentially a MOS process and add steps as needed to include a bipolar subprocess in the overall fabrication process. A few take the opposite approach.

A mixed bipolar-CMOS process is described, and the bipolar process is illustrated, in "A Bipolar Process That's Repelling CMOS," Electronics, Dec. 23, 1985, pages 45–47. One example of a mixed bipolar-CMOS circuit is disclosed in J. Miyamoto, et al., "A 28ns CMOS SRAM with Bipolar Sense Amplifiers," 1984 IEEE National Solid-State Circuits Conference Digest of Technical Papers, pages 224–225, 344 (1984). Mixed processes are briefly discussed, and additional references cited, in Brown, D. M., et al., "Trends in Advanced Process Technology—Submicrometer CMOS Device Design and Process Requirements," Proc. IEEE, Vol. 74, No. 12, pp. 1678–1702, Dec. 1986, at p. 1694.

The principal drawback, however, of all of these technologies has been an inability to produce very fast bipolar transistors in a mixed bipolar-MOS process. The mixed-process chips reported in the above-cited Cole article generally exhibit bipolar speeds in the range of 2–3 GHz. Only one process, of Hughes Aircraft Co.'s Semiconductor Division, is reported to produce NPN transistors with cutoff frequencies in excess of 5 GHz and PNP devices of over 2.5 GHz. The Hughes process is described as somewhat more complex and expensive than most other mixed processes, with 20 masking steps.

Another mixed process is disclosed in Ogive, K., et al., "13-ns, 500-mW, 64-kbit ECL RAM using HI-BICMOS Technology," IEEE Journal of Solid-State Circuits, Vol. SC-21, No. 5, pp. 681–685, Oct. 1986, which reports a cutoff frequency of 4 GHz.

These bipolar performance characteristics would be considered rather slow in terms of the current state of bipolar-only art. Most bipolar processes in current commercial use produce bipolar speeds in the range of 5–7 GHz. Recently, a new generation of bipolar devices has emerged which exhibit speeds in the range of 9–17 GHz. All of these devices are produced by processes that are substantially more complex and critical than those used to produce mixed bipolar-MOS devices or bipolar-only devices in the 5–7 GHz range.

Advanced bipolar technologies generally use a self-aligned process technology to attain very high speed device performance. Examples of these processes are disclosed in U.S. Pat. No. 4,381,953 to Ho et al., U.S. Pat. No. 4,483,726 to Isaac et al.; T. Ning et al. "Bipolar Trends," Proc. IEEE, Vol. 74, No. 12, pp. 1669–1677, Dec. 1986; and in S. Konaka, "A 30 ps Si Bipolar IC Using Super Self-Aligned Process Technology," Extended Abstracts 16th Conference on Solid State Devices and Materials, pages 209–212 (1984). A circuit fabricated using the Konaka et al. process is disclosed in "A 9-GHz Frequency Divider Using Si Bipolar Super Self-Aligned Process Technology," IEEE Electron Device Letters, Vol. EDL-6, No. 4, pages 181–183 (Apr. 1985).

A metal-oxide-semiconductor field-effect transistor (MOSFET) of conventional form is shown in FIG. 1. The conventional p— channel MOSFET 20 comprises a substrate 22 of p+ silicon having source and drain regions 24 and 26 of n+ material formed therein immediately beneath the upper surface 28 of the substrate. The source and drain regions are bounded by field oxide layer 29, and are separated by a channel region 30, in which the p+ material of the substrate extends to the upper surface 28. A PN junction is formed between the P+ silicon and each of the N+ regions. The spacing between the source and drain regions defines a channel width of region 30. A thin layer 32 of thermally-formed or chemical vapor deposited (CVD) silicon dioxide overlies the channel region and the immediately adjacent margins of the source and drain regions 24 and 26, and a gate 34 of polysilicon overlies the layer 32. A layer 36 of CVD silicon dioxide is applied over the source and drain regions and over the gate 34. Holes 38 and 40 are formed in the layer 36 to expose the source and drain regions 24 and 26, respectively. A third hole (not shown) is formed out of the plane of the drawing so as to expose the gate 34. Metal, e.g., aluminum, is deposited over the layer 36 and enters the holes in the layer 36. The metal is selectively removed so as to form distinct source and drain contact electrodes 42 and 44 and a gate contact electrode (not shown). When the electrodes 42 and 44 are connected to ground and a positive voltage respectively, and the gate is at approximately ground or negative potential (depending on the threshold voltage $V_t$, which may be above or below "ground"), the source and drain regions are electrically isolated by the PN junction between the drain region 26 and the channel region 30. When the voltage at the gate is increased, an inversion layer is formed in the channel region immediately beneath the gate. Electrons can flow from the source region 24 to the drain region 26 through this inversion layer.

In the conventional MOSFET shown in FIG. 1, the holes 38 and 40 are formed by a photoprocessing operation that involves aligning a mask relative to the gate 34, and the electrodes 42 and 44 make contact directly to the source and drain regions, respectively. To allow for errors in locating and aligning the mask, the source and drain regions must be made sufficiently large to ensure that the electrodes 42 and 44 will make contact to the source and drain regions. The capacitance of the PN junctions between the bulk semiconductor material and the source and drain regions, respectively, depends on the area of the interfaces between the bulk material and the source and drain regions, respectively. This area in turn depends on the area of the surface 28 exposed on each side of the gate oxide 32. To obtain high speed operation, it is necessary to minimize the capacitance of the PN junctions. Therefore, it is necessary to minimize the exposed area of the surface 28. For a given channel width, this implies that the distance between the gate oxide and the field oxide must be minimized.

C. S. Oh and C. K. Kim "A New MOSFET Structure with Self-Aligned Polysilicon Source and Drain Electrode," IEEE Electron Device Letters, Vol. EDL-5, 1984, pages 400–402, disclose a MOSFET process in which the source and drain contacts are self-aligned with the source and drain regions. The source and drain electrodes are positioned over the field oxide. Therefore, the distance between the gate oxide and the field oxide can be made much smaller than in the case of the FIG. 1 device, with the result that higher speed operation is possible.

Another MOS process having similar objects is disclosed in Huang, T. Y. et al, "A MOS Transistor with Self-Aligned Polysilicon Source-Drain," IEEE Electron Device Letters, Vol. EDL-7, No. 5, May 1986, pp. 314–316. This process inverts many of the steps of Oh and Kim. The polysilicon and overlying insulative layers are first applied. Then a reverse-gate mask and etch procedure is used to open the active channel region. A layer of gate oxide is thermally grown and a second polysilicon layer is deposited to form the gate contact.

In order to minimize the channel length (and therefore maximize the operating speed), the regions of the PN junctions that are immediately adjacent the channel region must be lightly doped. Also, to maximize the source/drain breakdown voltage of a MOSFET, it is desirable that the drain region be lightly doped immediately adjacent the channel region. The source region and the major part of the drain region should be more heavily doped to minimize the source/drain resistance when the MOSFET is in its conductive state. Thus, the drain region is preferably formed in two zones: a lightly doped zone that extends at least partially under the gate, and a more heavily doped zone that connects the lightly doped zone to the drain electrode.

A known method of providing different doping levels within the drain region of a MOSFET is illustrated in FIG. 2. As shown in FIG. 2(a), the gate structure 32/34 is formed on the substrate 22. Then, a first ion implantation operation is carried out, providing a relatively low concentration of charge carriers in regions 40 on each side of the gate structure. A silicon dioxide layer 44 of uniform thickness is deposited over the gate structure and the adjacent areas of the upper surface of the substrate (FIG. 2(b)). The silicon dioxide of the layer 44 is selectively removed by reactive ion etching to a depth equal to the thickness of the layer 44, so as to expose substrate surface 28 but leave walls 46 extending along the sides of the gate structure 32/34 (FIG. 2(c)). A second ion implantation is then carried out, providing a higher concentration of charge carriers, sidewalls 46 acting as an implantation mask. Therefore, the source and drain regions each have two zones 48 and 50, of high and low conductivity, respectively. For ease of processing, the same operations are carried out on both sides of the gate.

The method described by Oh and Kim does not lend itself to the establishment of different doping levels within the drain region. Nor does the process of Huang et al. Processes disclosed in D. M. Brown et al., supra, p. 1682, FIG. 7, and p. 1690, FIG. 22, can produce such different doping levels, but employ metal source and drain contacts to the silicon substrate and added process steps.

In S. S. Wong et al., "Elevated Source/Drain MOSFET," IEDM Tech. Dig., 1984, pages 634–637, there is described a method for providing a high conductivity layer over the source and drain regions of a MOSFET by forming an epitaxial layer of silicon over the source and drain regions, but not over the gate structure, and implanting ions into the epitaxial layer and the gate structure. However, this method is subject to a disadvantage in that deposition of an epitaxial layer is normally carried out at high temperature, and high temperature processing is considered undesirable in fabrication of a MOSFET having a lightly-doped drain.

S. S. Wong, "Contact Technologies for Submicron CMOS," Cornell Program on Submicrometer Structures, 1985, discusses the use of a metal silicide contact layer over the source and drain regions to minimize the source/drain resistance. The silicide layer is formed by first depositing a layer of polysilicon over the source and drain regions and then depositing of a layer of refractory metal over the polysilicon. The device is then annealed, and the metal silicide layer is formed.

It is also known to use an oxide sidewall structure in making bipolar transistors, to define a spacing between polysilicon emitter and base contacts. This is shown by S. F. Chu et al. in "A Self-Aligned Bipolar Transistor," VLSI Science and Technology/1982 Proceedings Vol. 82-7, pp. 306–314. The process shown also uses successive implant and diffusion steps to form the intrinsic base and emitter from the layer of polysilicon forming the emitter contact. This procedure is detailed in another paper in the same Proceedings, presented by F. Barson et al., entitled "Shallow Bipolar Transistor Profiles by Diffusion from Implanted Polysilicon," pp. 282–287. It produces a very high speed bipolar transistor, with a cutoff frequency demonstrated to be as high as 15 GHz, but no way is suggested that makes this high speed available together with the high density and low power consumption of CMOS.

A need remains for a process that overcomes the drawbacks of the foregoing MOS and bipolar processes. Additionally, it would be desirable to have a process that can readily be used to produce mixed bipolar-MOS circuit.

SUMMARY OF THE INVENTION

In accordance with the invention, a bipolar transistor and a metal-oxide semiconductor field-effect transistor (MOSFET) are fabricated on a common substrate of semiconductor material having a main face and containing impurity ions that provide charge carriers of a first polarity. The substrate can be bulk crystalline silicon material but is preferably provided with a uniformly-doped epitaxial layer in which the bipolar, PMOS and NMOS devices can be formed in suitably-doped active device regions. The term "substrate" is intended to encompass both kinds of substrate, except where one kind is specified, as in the preferred embodiment. The dopant type or polarity of the active device regions depends on the type of device. Preferably, the epitaxial layer is N-type, for NPN bipolar and PMOS devices, with a P-well formed for the NMOS devices. The MOS and bipolar devices are simultaneously formed in parallel steps. For clarity, however, the process of forming the MOS devices is first summarized.

An elongated insulated gate structure is formed on the main face of the substrate in each of the MOS regions. First and second areas of the main face are exposed along first and second opposite sides respectively of the gate structure. Impurity atoms that provide charge carriers of a second polarity, opposite the first polarity, are introduced into the substrate by way of at least the first area of the main face, to achieve a predetermined concentration of charge carriers of the second polarity in a drain region of the substrate that is subjacent the first area of the main face. This is preferably done by ion implantation, controlled to produce lightly-doped drain and source regions. The gate structure, preferably of polysilicon, is opaque to the impurity atoms, and therefore the drain region does not extend fully under the gate structure. Nevertheless, the drain region has a channel-side zone that lies under the margin of the gate at the first side thereof. A sidewall of a selected material, such as silicon dioxide, is formed along the first side of the structure, whereby a strip of the first area of the main face is covered by the sidewall and other parts of the first area remain exposed adjacent the sidewall. Atoms of a selected impurity, to which the gate structure and the sidewall are opaque, are introduced into the substrate by way of the portion of the first area that is exposed adjacent the sidewall. The atoms of the selected impurity provide charge carriers of the second polarity. A zone that extends partially within the drain region, but does not extend fully under the sidewall, and in which the conductivity is provided by charge carriers of the second polarity and is higher than that in the channel-side zone of the drain region, is created. Self-aligned source and drain contacts are then formed, preferably by the following procedure. A layer of conductive material, preferably polysilicon, is deposited over the portion of the first area of the main face that is exposed adjacent the sidewall. This layer extends up the sidewall and over the gate structure. A layer of a selected material, such as a planarizable synthetic polymer, is formed over the layer of conductive material to a substantially uniform height over the main face. The height of the free surface of the layer of selected material is at least as great as the maximum height of the layer of conductive material over the gate structure. The selected material is uniformly thinned to expose the layer of conductive material over the gate only, which coincides with its region of maximum height. The conductive material at a height that is at least as great as that of the gate structure is then removed. Some degree of additional removal of conductive material may be used to optimize this structure. A discrete drain contact is thereby formed. The second side and an adjacent strip of the second area can be likewise covered and doped, and a discrete source contact formed in the foregoing procedure. The source and drain contacts are preferably provided by a polysilicon layer, implanted with appropriate impurity atoms for each type of MOS device and subjected to a drive-in treatment to form increased doping concentration regions beneath the contacts.

The bipolar devices are formed in parallel with the MOS devices, in accordance with essentially the same process steps but with patterning of the steps in a way suited to forming a bipolar structure. A base contact structure is formed when the gate structure is formed, in two portions spaced apart about a third exposed area of the substrate surface, preferably in the shape of a rectilinear annulus. Preferably, the substrate in the third area is lightly doped by ion implantation with atoms of the second impurity when the drain of the like-dopant type of MOS device is doped (for an NPN transistor, this is when the PMOS source/drain are doped). The same doping concentrations and profiles can used for both devices, for simplicity of fabrication, but different implants can be used to optimize respective device characteristics. Then, the sidewalls are formed on the sides of the base contact portions when they are formed on the MOS gate structures, with the effect of reducing the third area and shielding a marginal strip thereof. This is followed by a second doping step, which coincides with the second doping of the first and second areas of the MOS devices. An emitter and emitter contact are also formed. These steps are preferably combined in a second polysilicon deposition step, the same as that used to form the source/drain contacts, followed by implantation and drive-in steps. Implantation of the polysilicon is preferably done in two steps: first, of the second polarity impurity type, to dope the base to a higher concentration but lesser width and no greater depth than those of the lightly doped base region formed in the ion implantation step; and secondly, of the first polarity type to form an emitter of lesser width and depth of the base. This procedure forms a lightly-doped base connection within the substrate, similar to the above-mentioned lightly-doped drain but with different effect in the bipolar transistor. The lightly-doped base connection provides a relatively low breakdown voltage which has little variance from one bipolar device to the next.

The foregoing and other objects, features and advantages of the invention will become more readily apparent from the following detailed description of a preferred embodiment which proceeds with reference to the accompanying drawings.

BRIEF DESCRIPTION OF THE DRAWINGS

FIGS. 3-12 are a series of views illustrating fabrication of a mixed bipolar-CMOS integrated circuit by a process embodying the present invention.

FIGS. 13-16 are a series of views of a portion of the circuit at the intermediate stage of FIG. 7, illustrating a subprocess for diffusion of both base and emitter of the bipolar transistor.

Figure 1:
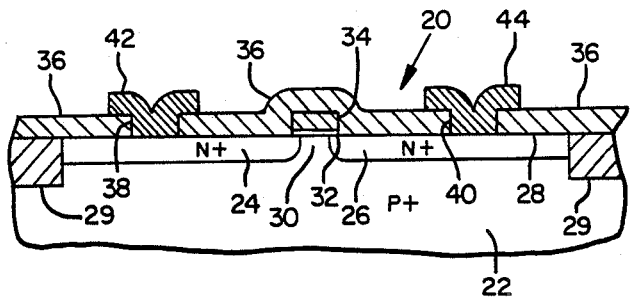
FIG. 1 is a schematic sectional view of a conventional MOSFET structure.
Figure 2:
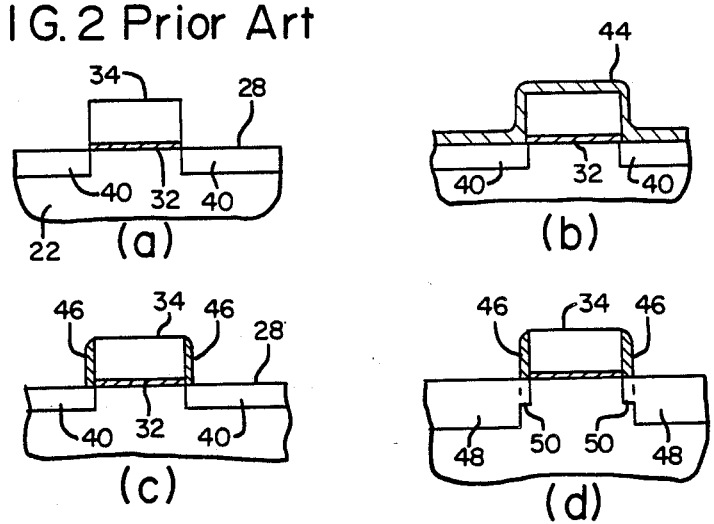
FIGS. 2a-d is a series of views illustrating formation of an oxide box about the gate of a MOSFET.

TABLE 1, appended to this specification, is a process-flow listing of the photolithographic and major process steps, and preferred process techniques and conditions, for an example of the method of FIGS. 3-12.

In the different figures, like reference numerals denote like elements. For a better understanding, reference will also be made, by way of example, to the photolithography and process steps in TABLE 1.

DETAILED DESCRIPTION

Figures 3, 4, 5, 6:
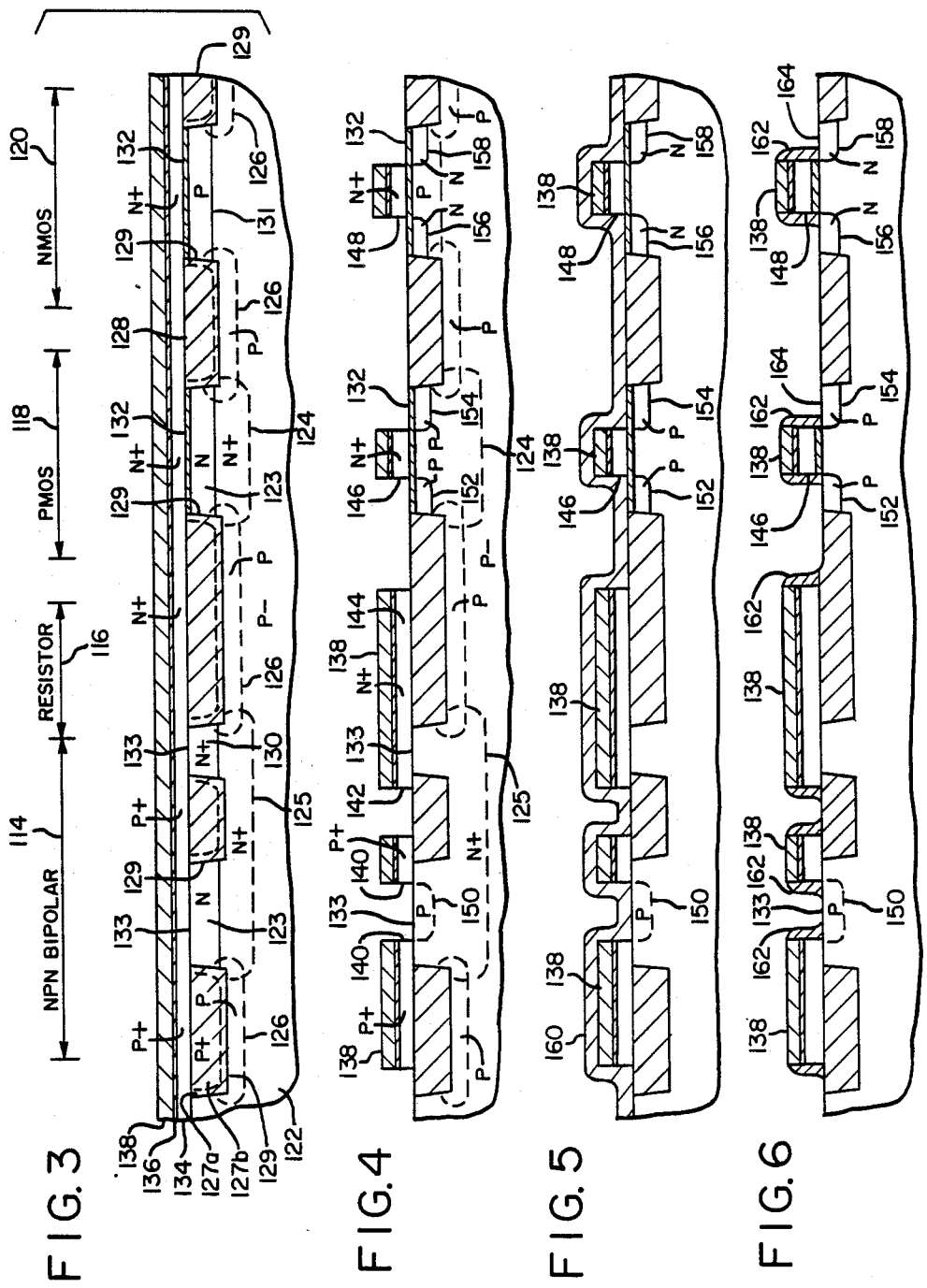

A wafer 122 of P-type, (100) oriented silicon of 40–100 ohm-cm resistivity is processed in accordance with process steps 1–34 of TABLE 1 to produce the substrate as shown in FIG. 3. These process steps are discussed in conjunction with describing the masking steps used to produce the intermediate mixed bipolar-CMOS structure of FIG. 3. As indicated in FIGS. 3 and 12, an NPN bipolar transistor is formed in region 114, a resistor in region 116, a PMOSFET in region 118, and an NMOSFET in region 120.

A layer of oxide (not shown) is thermally grown on the wafer, patterned and etched to define a mask for a buried layer ion implant. This procedure produces N+ ($10^{16}$ concentration) buried layers 124 and 125 beneath the intended bipolar and PMOS device regions. This is followed by an annealing step.

Next, in step 7, the oxide layer is removed and an epitaxial layer 123 of 1.3 to 1.6 um. thickness (nominally 1.5 um.) is deposited on the wafer surface. This layer is uniformly N-type, in a concentration sufficient to produce a resistivity of about 0.2 to 0.3 ohm-cm. at a thickness of 1.3 um. This is followed by thermal oxidation and plasma oxide deposition steps to form another oxide masking layer (not shown). This layer serves as a P-well implant mask, which is patterned and etched in step 10 to expose the epitaxial silicon surface in NMOS region 120. In steps 11 and 12, P-type ions are implanted and diffused, by a heat treatment process, to form P-type region 131 extending through the epitaxial layer into the bulk of the substrate 122. This provides a P-well for the NMOS device to be formed in later steps in region 120. A PMOS field effect transistor (region 118) will be formed, in succeeding steps, on the substrate surface over buried layer 124. An NPN bipolar transistor (region 114) will be formed in subsequent steps over buried layer 125.

Following P-well drive-in, in steps 13 and 14, a second masking step is performed to pattern and etch silicon islands upon which the active devices will be formed, surrounded by recessed areas of the substrate. The recesses extend through the epitaxial layer 123 to or into the bulk substrate material 122. In steps 17 and 18, these recessed areas are filled with silicon dioxide to electrically isolate the active silicon islands. First, however, a P-type field implant step is performed to define channel stops 126 within the bulk substrate material 123 between the active device regions (step 15). After stripping the mask oxide (step 16), the entire exposed silicon surface is thermally oxidized to a depth of about 1,000 angstroms. This is followed by a low temperature chemical vapor deposition step to deposit a layer of silicon dioxide over the entire substrate surface. The thermal oxidation step produces an oxide layer 127a in the recessed regions. The deposition step fills the remaining space of these recesses with silicon dioxide 127b. By reactive ion etching (RIE), the oxide is planarized and reduced to a surface elevation 128 where epitaxial silicon in the active regions is exposed (step 19). This procedure produces planarized, recessed, bird's-beak-free field oxide regions 129.

Next are thermal oxidation, masking, P-type implant and drive-in steps (steps 20–23) for implanting active P-type region 131. An NMOS field effect transistor (region 120) will be formed in subsequent steps on the substrate over this region. An oxidation step produces a 200–300 angstrom thick gate oxide layer 132 on the substrate surface in each of the PMOS and NMOS regions 118, 120 (step 24). Separate threshold voltage masking and implant steps are performed in regions 118 and 120 for determining the gate threshold voltages for each type of MOS device (step 25). Then, a deep collector masking and implant steps are performed to implant collector contact region 130 to an increased, N+ concentration (steps 26 and 27). Next are clear oxide photolithography and etching steps (step 28), which clears the portions of oxide layer 132 in region 114 to selectively expose silicon surface 133 in the bipolar device region 114 for performing succeeding steps.

Next, a first polysilicon layer 134 is chemical vapor deposited to a thickness of 4000–5000 angstroms (step 29). This layer is then masked and implanted, first, to implant the polysilicon layer to N+ concentrations over the PMOS and NMOS active device regions and over the collector contact region 130 (steps 30 and 31). The N+ implant mask is stripped and the substrate is again masked and implanted to dope the polysilicon layer overlying the NPN bipolar active region to P+ concentrations (steps 32 and 33). The photoresist is then stripped.

Optionally, a layer of suitable metal is deposited on the polysilicon and reacted and removed to form a polysilicide layer 136. This is done by depositing a layer of refractory metal such as titanium over the polysilicon layer and then annealing the refractory metal to form a low-resistivity silicide ($TiSi_2$), as shown in S. S. Wong, "Contact Technologies for Submicron CMOS", Cornell Program on Submicrometer Structures, 1985. In combination with ion implantation, siliciding the polysilicon can reduce its resistivity by two orders of magnitude.

Next, in step 34, a layer 138 of silicon dioxide is chemical vapor deposited to a thickness of about 5,000 angstroms.

Referring next to FIG. 4, gate/base/collector masking and etching steps 35 and 36 are performed to define base contacts 140, collector contact 142 and resistor 144, and MOSFET gate electrodes 146, 148. Masking and boron implant steps (steps 37 and 38) provide P-type base region 150 for the bipolar transistor in region 114 and lightly-doped P-type source and drain regions 152, 154 for the PMOSFET in region 118. These steps are further discussed below in connection with FIGS. 13–17. Mask and implant steps 39 and 40 similarly provide N-type source and drain regions 156, 158 for the NMOSFET in region 120.

FIGS. 5 and 6 illustrates process steps 41–44. A 0.5 um to 1.0 um layer 160 of silicon dioxide is deposited and annealed. This layer is then reactive ion etched to remove preferentially those horizontal portions lying parallel to the silicon surface while leaving vertical portions or sidewalls 162. An oxide box structure is thus formed by oxide layer 138 and sidewalls 162. The box structure encloses each of the underlying polysilicon electrodes, specifically base contact portions 140 and gate electrodes 146, 148. This step also exposes silicon surface 164 on both sides of the gate electrodes and surface 133 between the base contact portions 140.

Figure 7:
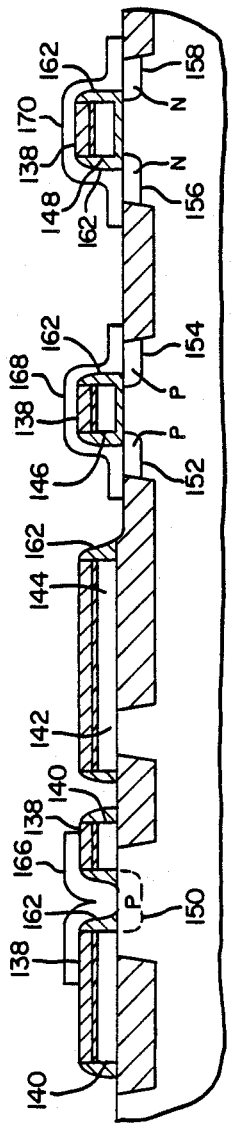

Proceeding to FIG. 7 and process steps 45–51, a second layer of polysilicon is deposited over the substrate, the oxide box structure 138, 162 and the field oxide regions 129. This layer is silicided and selectively doped in successive mask and implant steps, and patterned and etched, to form an N+ emitter contact 166, a P+ source/drain contact structure 168 and an N+ source/drain contact structure 170. These steps are further discussed with reference to FIGS. 13-17, below.

Figure 8:
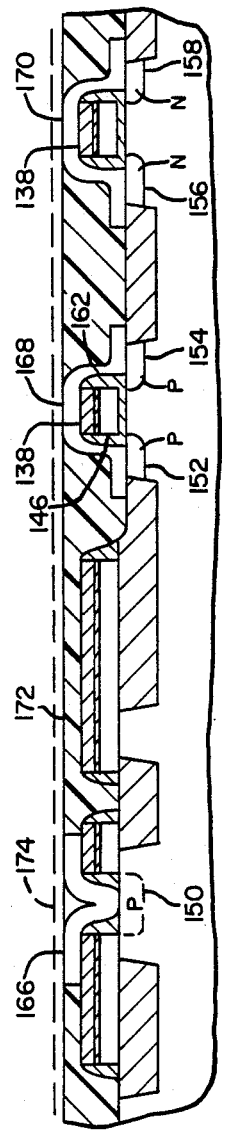
Figure 9:
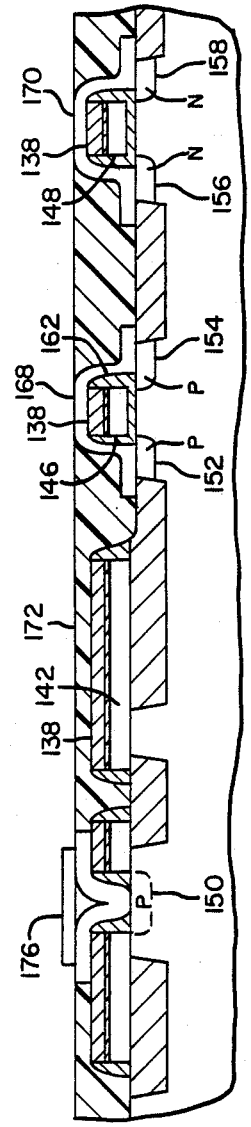
Figure 10:
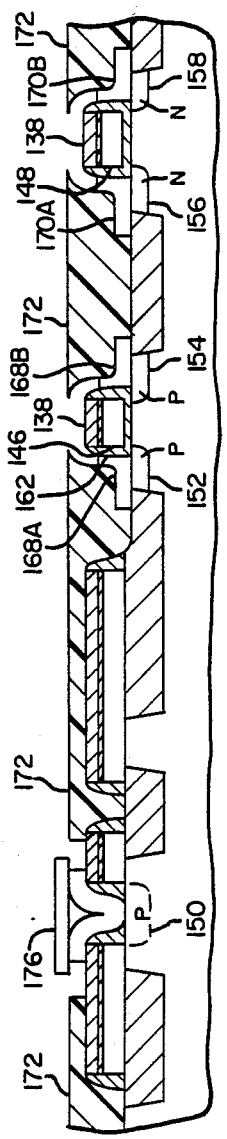

FIGS. 8-10 illustrate process steps 52-54, by which the source/drain contact structures are separated to form separate self-aligned source and drain contacts. A layer 172 of synthetic polymer material is applied to the FIG. 7 structure. The layer of polymer material is applied by a method known as polymer planarization, which is described in A. C. Adams and C. D. Capio, "Planarization of Phosphorus Doped Silicon Dioxide", J. Electrochem. Soc., vol. 128(2), 1981, page 423; L. K. White, "Planarization Phenomena in Multilayer Resist Processing", J. Vac. Sci. Technol., vol. B1(4), 1983, page 1235; and L. K. White, "Planarization Properties of Resist and Polyimide Coatings", J. Electrochem. Soc., vol. 130(7), 1983, page 1543. The free surface of the resultant layer 172 is planar and is parallel to the upper surface of the wafer. The initial maximum depth 174 of the layer 172 is sufficient that the polysilicon contact structures 166, 168, 170 are fully covered.

The polymer material is then exposed to an etchant which etches the polymer anisotropically, that is, primarily in a direction perpendicular to the substrate surface 133. This etching continues until the contact structures 168, 170 are exposed over the oxide boxes 138, 162 at surface 174. An etchant may alternatively be chosen which etches both the polymer and polysilicon at substantially the same rate. This step is preferably followed by a masking step to protect emitter contact 166 with a photoresist layer 176, as shown in FIG. 9. A second etching operation which demonstrates a controlled degree of anisotropy is then carried out as shown in FIG. 10. This step employs an etchant that attacks polysilicon but does not attack either the polymer material or silicon dioxide. The second etching operation is carried out in the direction perpendicular to the upper surface 133 of the substrate until the free surface of the polysilicon is below the top of the oxide boxes 138, 162 surrounding gate structures 146, 148. In this manner, the polysilicon source/drain contact structures 168, 170 are each divided into two portions. This step forms separate source and drain contacts 168A and 168B overlying the source and drain regions 152 and 154, respectively, and source and drain contacts 170A and 170B overlying regions 156 and 158, respectively. The polymer material 172 is then removed.

Next, in FIG. 11, a layer 179 of silicon dioxide is deposited over the entire substrate, including over contacts 168A, 168B and 170A, 170B and over the oxide box structures 138, 162 (step 55). The substrate is then annealed in step 56, to diffuse dopant ions from the polysilicon layers into the underlying substrate silicon. This step produces an N+ emitter 178 and P+ base contact regions 180 in the bipolar transistor (region 114), P+ source and drain contact regions 182, 184 in the PMOSFET (region 118), and N+ source and drain contact regions 186, 188 in the NMOSFET (region 120). The base and gate contact diffusions lower base resistance in the bipolar and MOS transistors. Diffused emitter junctions formed in this manner are very shallow, typically less than 0.1 um for arsenic and less than 0.2 um for boron, which enables very high speed bipolar operation. Diffusion of source and drain contact regions is similarly limited so as to produce a gradation of dopant concentration that decreases proceeding downward and laterally from regions 182, 184 and 186, 188 in regions 152, 154 and 156, 158, respectively. This doping profile yields a narrow, high-speed FET gate with enhanced breakdown voltage while keeping source and drain resistance low.

In FIG. 12, holes are then formed in the layer 179 in conventional manner to expose the base (B), emitter (E) and collector (C) contacts of the bipolar transistor, a resistor contact (R), and source (S) and drain (D) contacts, respectively, of the FET devices. A third hole (not shown) is formed to expose the gate of each of the FET devices. Metal (not shown) is deposited over the layer 179 in conventional fashion and enters the holes in the oxide layer. The metal is selectively removed to form discrete base, emitter and collector electrodes, a connection to resistor 116, source, and drain gate electrodes, and metal interconnections as desired by the designer.

It will be appreciated that the present invention is not restricted to the particular method and structure described above. Instead of an epitaxial substrate with N-type buried layers, with some sacrifice in device speed, a p+ substrate with N-wells for the NMOS and bipolar transistors can be used. One or both silicide steps can be omitted, or applied selectively (e.g., omitted from resistor 144) by appropriate masking, to vary sheet resistances. In another variation, collector contact 142 and resistor 144 can be formed as part of the second, rather than first, polysilicon layer.

In yet another, preferable variation, the bipolar transistor base region 150 is not formed in toto by direct implantation in steps 37 and 38. Although it will yield operative bipolar transistors, it is difficult to control final base depth and width. Preferably, the region 150 is formed as lightly-doped connection between an intrinsic base 177 (FIG. 14) to be formed in step 46 and the base contact diffusions 180, which are more highly doped. For simplicity, all of the regions 150, 152, 154 can be simultaneously implanted to a concentration of about $10^{13}$ and a depth not more than the maximum desired depth of the intrinsic base 177, preferably about 2000 angstroms. If it is desired to vary the implant concentrations between the bipolar and PMOS devices, this can be done by using two masking and P-type implant steps, with minimum requirements for critical alignment. Steps 46 and 47 are performed after steps 48 and 49, with an intervening base drive-in step. This procedure is designed to diffuse both the base 177 and emitter 178 from successive implants of boron and arsenic into emitter contact 166. It is carried out without materially increasing complexity of the mixed bipolar-CMOS process of the invention.

Figure 17:
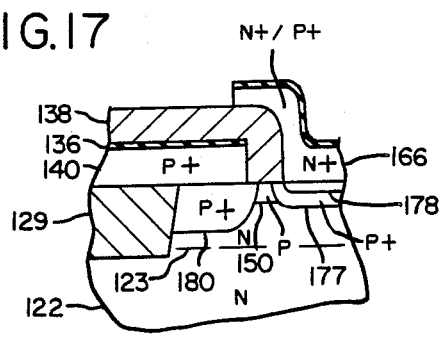
FIG. 17 is an enlarged view of a portion of the bipolar transistor formed by the process of FIGS. 3-16.

In this technique, as shown in FIGS. 13 and 14, boron ions are implanted in the undoped-polysilicon emitter 166, and diffused to form a shallow intrinsic base 177. Then, as shown in FIGS. 15 and 16, arsenic ions are implanted to the same emitter polysilicon, and diffused to form a shallow emitter 178. The result of implanting a lightly-doped region 150, followed by the foregoing successive implants, is shown in FIG. 17. The resultant bipolar structure has very good characteristics, as described below.

A self-aligned $TiSi_2$ layer is formed on top of the emitter polysilicon and this emitter polycide reduces the sheet resistance of the emitter polysilicon (As+ implanted and 2500 angstrom thick) from 300 ohm/sq. to 3-10 ohm/sq. with an arsenic implant dose of 3E1-

5-5E15 ions/cm$^2$. The resultant bipolar transistor is compared with two alternative transistors similarly fabricated, but with the emitter and base both directly implanted and the emitter diffused and base implanted. Table 2 compares the junction depths of each transistor and Table 3 compares their respective device parameters.

TABLE 2.

Junction depths of variously processed emitter and base.

|  | Diffused E-B | Implanted E-B | Diffused E & Implanted B |
|---|---|---|---|
| $X_{je}$ | 500 angstrom | 1400 angstrom | 500 angstrom |
| $X_{jb}$ | 1500 angstrom | 3200 angstrom | 3300 angstrom |
| $W_b(m)$ | 1000 angstrom | 1800 angstrom | 2800 angstrom |

TABLE 3.

Device parameters.

|  | Diffused E-B | Implanted E-B | Diffused E & Implanted B |
|---|---|---|---|
| E(um$^2$) | 0.5 × 4 | 0.5 × 4 | 0.5 × 4 |
| $h_{fe}$ | 60 | 100 | 38 |
| $LV_{ceo}(V)$ | 6.8 | 7.5 | 8 |
| $BV_{cbo}(V)$ | 19 | 21 | 16 |
| $BV_{ebo}(V)$ | 8.5 | 3 | 3.5 |
| $V_A(V)$ | 20 | 28 | 68 |
| $R_b$(ohm) | 400 | — | — |
| $R_e$(ohm) | 60 | 70 | — |
| $R_c$(ohm) | 220 | 300 | — |

TABLE 3.-continued

Device parameters.

|  | Diffused E-B | Implanted E-B | Diffused E & Implanted B |
|---|---|---|---|
| $f_t$ | 15.6 GHz | 8.9 GHz | 5.2 GHz |
| $G_m$ | 15.9 GHz | — | — |
| $N_b$(cm$^{-3}$) | 1.6E18 | 7E17 | 4E18 |

In an NPN transistor having both the base 177 and emitter 178 diffused from the polysilicon emitter contact, the breakdown voltage characteristic BVceo with implanted region 150 also compares favorably with the same device structure without such region. At Irev=1E−06, the former shows a very tight distribution with an average BVceo of 6.016 and standard deviation of 0.525, compared to a widely dispersed distribution over a range from 0.4 to 4.8 for the latter. The $h_{FE}$ characteristic is similarly distributed; at Ic=1E−04 and Vcb=2, an average of 105.3 and standard deviation of 12.06, with a range of 85 to 125 for the former, compared to a range of about 50 to 130 with most occurrences clustered between 60 and 90 for the latter.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

TABLE I

BIP/CMOS PROCESS FLOW

| No. | Photo | Major Process Steps | TEC | Process Conditions | Min. Process |
|---|---|---|---|---|---|
| 1 |  | Starting substrate |  | p-Si |  |
| 2 |  | Grow Oxide |  | thermal oxide 3000A |  |
| 3 | 1 | BL Photo |  | photo buried layer |  |
| 4 |  | Oxide Etch |  |  |  |
| 5 |  | BL ion implant | I/I | As, +50 Kev, 1G16 | Strip p.r. |
| 6 |  | BL Anneal |  | 600C, 60 min. | Strip oxide |
| 7 |  | Epi |  | N, 1.5u,~ 0.2-0.3 ohm cm |  |
| 8 |  | Oxidation |  | thermal oxide 300A |  |
| 9 |  | Oxide Dep |  | plasma oxide 3000A |  |
| 10 | 2 | P-well photo |  | photo + oxide etch |  |
| 11 |  | P-well implant | I/I | B+, 170k, 7E12-2E13 | Strip p.r. |
| 12 |  | P-well drive-in |  | 1100C 60-180 min. |  |
| 13 | 3 | Si island photo |  | Si island photo + duv |  |
| 14 |  | Si island etch | RIE | Si island etch |  |
| 15 |  | Field implant | I/I | 11B+, 40k, 3-10E12 | Strip p.r. |
| 16 |  | Strip mask oxide |  | strip oxide 3000A |  |
| 17 |  | Oxidation |  | thermal oxide 1000A |  |
| 18 |  | Refill oxide | CVD | LTO 2.2u deposition |  |
| 19 |  | Field plana. | RIE | SAM field plana. | Strip p.r. |
| 20 |  | Oxidation |  | thermal SiO2 300A |  |
| 21 | 4 | Deep coll photo |  | coll implant photo |  |
| 22 |  | Deep coll implant | I/I | 31P+, 170K, 5E14-1E15 | Strip p.r. |
| 23 |  | Drive-in |  |  |  |
| 24 |  | Gate oxidation |  | SiO2 200-300A |  |
| 25 | 5 | Vt photo |  | Vt photo |  |
| 26 |  | Deep 11B+ implant | I/I | 11B+, 150K, 2-5E12 | Strip p.r. |
| 27 |  | Shallow 11B+ implant | I/I | 11B+, 30k, 1-2E12 |  |
| 28 | 6 | Clear gate photo |  | clear oxide photo + oxide etch |  |
| 29 |  | 1st poly deposit | CVD | poly deposit 4000-5000A |  |
| 30 | 7 | N+ poly photo |  | N+ poly implant photo |  |
| 31 |  | N+ poly implant | I/I | 31P+, 60-80k, 5E15 | Strip p.r. |
| 32 | 8 | P+ poly photo |  | P+ poly implant photo |  |
| 33 |  | P+ poly implant | I/I | 11B+, 30k, 5E15 | Strip p.r. |
| 34 |  | Deposit oxide | CVD | LTO (or plasma ox) 5000A |  |
| 35 | 9 | Gate/base/coll photo |  | poly photo + duv |  |
| 36 |  | Oxide/poly etch | RIE | RIE oxide/O2 pla/poly |  |
| 37 | 10 | Act base/P-LDD photo |  | act base/PMOS LDD photo |  |
| 38 |  | Act base/P-LDD implant | I/I | 11B+, 25-30k, 5-10E13 | Strip p.r. |
| 39 | 11 | NMOS LDD photo |  | NMOS LDD I/I photo |  |

TABLE I-continued

BIP/CMOS PROCESS FLOW

| No. | Photo | Major Process Steps | TEC | Process Conditions | Min. Process |
|---|---|---|---|---|---|
| 40 | | NMOS LDD implant | I/I | 75As+, 100k, 1E14 | Strip p.r. |
| 41 | | Deposit oxide | CVD | LTO (or plasma ox) .5-1u | |
| 42 | | Anneal oxide | | oxide anneal 850-900C 30 min | |
| 43 | | Oxide etch | RIE | sidewall oxide etch | Strip p.r. |
| 44 | | Oxy plasma clean | | PIC 400W 1torr 10 min | HF dip |
| 45 | | 2nd poly deposit | CVD | poly 2500-3000A | |
| 46 | 12 | N+ poly photo | | N+ poly implant photo | |
| 47 | | N+ poly implant | I/I | 75As+, 120k, 5E15 | Strip p.r. |
| 48 | 13 | P+ poly photo | | P+ poly implant photo | |
| 49 | | P+ poly implant | I/I | 11B+, 30k, 1-5E15 | Strip p.r. |
| 50 | 14 | Emitter/S-D photo | | emitter/S-D photo + duv | |
| 51 | | Poly etch | RIE | iso dry poly etch | Strip p.r. |
| 52 | | P.R. plana. | RIE | spin plana layer + etch back | |
| 53 | 15 | Emitter prot photo | | emitter protection photo | |
| 54 | | Poly etch | RIE | SAM poly etch | Strip p.r. |
| 55 | | Deposit oxide | CVD | LTO or plasma ox 3-5000A | |
| 56 | | Final drive-in | | drive-in 930-950C 30 min | |
| 57 | 16 | Contact photo | | contact photo | |
| 58 | | Contact oxide etch | RIE | oxide etch | Strip p.r. |
| 59 | | Plate-up base metal | | | |
| 60 | 17 | Metal photo | | Au plate-up photo | |
| 61 | | Au plate-up | | Au plate-up 1-1.5u | Strip p.r. |
| 62 | | Plate-up base etch | | plate-up base tech | |
| 63 | | Post metal anneal | | metal alloying 400-450C | |

We claim:

1. A method of fabricating a mixed process integrated circuit including a metal-oxide-semiconductor field-effect transistor (MOSFET) and a bipolar transistor on a common substrate, comprising the following steps, steps (f) and (g) not necessarily being in the order stated:

(a) providing a substrate of semiconductor material having a main face and containing impurity atoms that provide charge carriers of a first polarity;

(b) forming and patterning a first conductive layer to provide:
   (i) an elongate insulated gate structure of a predetermined height for the MOSFET on a first portion of the main face of said substrate, and first and second areas of the main face exposed along first and second opposite sides respectively of the gate structure, and
   (ii) a base contact structure for the bipolar transistor on a second portion of the main face of the substrate in contact with the semiconductor material, including first and second base contact portions having opposed third and fourth sides spaced apart about a third exposed area of the main face;

(c) introducing impurity atoms that provide charge carriers of a second polarity, opposite the first polarity, into the substrate by way of said first and second areas of the main face to form a lightly-doped drain region in the MOSFET, the gate structure being effective to mask the region of the substrate immediately subjacent the gate structure from the impurity atoms;

(d) forming a sidewall of a material that is opaque to atoms of a selected impurity along said first and second sides of the gate structure, and said third and fourth sides of the base contact structure, whereby a strip of the main face along each said side of the gate structure and base contact structure is covered by the sidewall but other parts of the first, second and third areas of the main face remain exposed;

(e) introducing atoms of the selected impurity into the substrate by way of those portions of the first, second and third areas which are exposed adjacent said sidewalls, the atoms of said selected impurity providing charge carriers of said second polarity to form heavily doped source and drain regions under the first and second areas in the MOSFET and a base region under the third area in the bipolar transistor;

(f) forming a second layer of conductive material over said exposed portions of said first, second and third areas, and over the gate structure;

(g) removing the conductive material of said second layer over the gate structure that is at a height over the main face that is at least as great as the height of the gate structure so as to form two discrete source and drain contacts for the MOSFET overlying said first and second areas respectively of the main face;

(h) forming an emitter in the substrate under the third area for the bipolar transistor; and (i) the portion of the second conductive layer formed over the exposed third area serving as an emitter contact so that complete, operative bipolar and MOSFET devices are fabricated on a common substrate with only two layers of conductive material.

2. A method according to claim 1, including selectively shielding the conductive material in the third area from removal, thereby to form a discrete emitter contact for the bipolar transistor overlying said third area and portions of the base contact structure.

3. A method in accordance with claim 1 including subsequently depositing a layer of dielectric material over said discrete contacts and over the gate and base contact structure; forming holes in the layer of dielectric material to expose the discrete contacts and the gate and base contact structure; and depositing metal into said holes.

4. A method according to claim 1, wherein step (g) is accomplished by forming a layer of a selected material over the layer deposited in step (h), the layer of selected material having a free surface that is substantially parallel to the main face of the substrate, removing said selected material anisotropically, in a direction substantially perpendicular to said main face, until said layer of conductive material is exposed over the gate structure but not over said first area or said second area.

5. A method according to claim 1, wherein step (c) is performed before step (d) and is performed by ion implantation.

6. A method according to claim 1, wherein the layer of conductive material formed in step (f) is doped with atoms of the selected impurity, and step (e) is performed after step (f) by thermally diffusing the atoms of the selected impurity from the layer of the conductive material into the substrate.

7. A method according to claim 1, wherein the layer of conductive material formed in the third area in step (f) is successively doped with atoms of the selected impurity, and step (e) is performed after step (f) by successively thermally diffusing the atoms of the selected impurity from the layer of the conductive material into the substrate.

8. A method according to claim 1 in which fabricating the bipolar transistor includes:
 in step (c), introducing impurity atoms that provide charge carriers of the second polarity, opposite the first polarity, into the substrate by way of said third area of the main face, the base contact structure being effective to mask the regions of the substrate immediately subjacent the base contact portions from the impurity atoms;
 step (e) includes introducing impurity atoms providing charge carriers of said second polarity into the substrate by way of a central portion of the area of the main face remaining exposed adjacent said sidewalls in a concentration sufficient to form a base; and
 step (h) includes introducing impurity atoms providing charge carriers of said first polarity into the substrate by way of the central portion of the main face in a concentration sufficient to form an emitter; and
 steps (c) and (e) further including controlling the introduction of impurity atoms of the second polarity into the third area of the main face so as to produce a first doping concentration beneath said sidewalls and a second doping concentration beneath said central portion such that the second doping concentration is greater than the first concentration.

9. A method according to claim 8, including controlling the introduction of impurity atoms of the second polarity into the third area of the main face so as to produce a first doping profile beneath said sidewalls and a second doping profile beneath said central portion such that the first doping profile has a depth from the main face that is no greater than the depth of the second doping profile.

10. A method according to claim 8, in which:
 step (c) includes implanting impurity atoms of the second polarity into the substrate to a first depth and said first concentration;
 step (f) precedes steps (e) and (h) and includes forming the conductive contact of a semiconductive contact material; and
 step (e) includes implanting impurity atoms of the second polarity into the semiconductive contact material and diffusing said atoms therefrom into the substrate to a second depth at least as great as the first depth to provide said charge carriers of second polarity in the central portion of the main face in said concentration sufficient to form said base.

11. A method according to claim 10, in which step (h) includes implanting impurity atoms of the first polarity into the semiconductive contact material and diffusing said atoms therefrom into the substrate to a third depth less than the second depth to provide said charge carriers of first polarity in the central portion of the main face in said concentration sufficient to form said emitter.

12. A method according to claim 8, in which:
 step (c) includes introducing said impurity atoms of the second polarity into the substrate to a first depth and said first concentration to form said base;
 step (f) precedes step (h) and includes forming the conductive contact of a semiconductive contact material; and
 step (h) includes implanting impurity atoms of the first polarity into the semiconductive contact material and diffusing said atoms therefrom into the substrate to a second depth less than the first depth by a predetermined amount to provide said charge carriers of first polarity in the central portion of the main face in said concentration sufficient to form said emitter.

13. A method according to claim 8, in which step (b) includes:
 depositing a semiconductor contact material on a portion of the substrate's main face, in contact with the semiconductor material, to form the base contact structure including said first and second base contact portions spaced apart about said exposed area of the main face;
 implanting impurity atoms of the second polarity into the semiconductive contact material; and
 diffusing said atoms therefrom into the portions of the substrate beneath the base contact portions to provide charge carriers of said second polarity in a concentration greater than said first doping concentration.

14. A method according to claim 8, including controlling steps (c) and (e) so as to produce a lightly-doped base region of a first width extending beneath the sidewalls on the base contact portions and a base region of increased doping concentration and a second width less than the first width by an amount proportioned to a thickness of the sidewalls.

15. A method according to claim 14, wherein the base contact structure is formed of a semiconductive material, including implanting atoms of the selected impurity into semiconductive base contact material and diffusing said atoms therefrom into the substrate to provide said charge carriers of second polarity in the substrate subjacent the base contact and spaced from the base region of increased doping concentration by a margin of the lightly-doped base region.

16. A method according to claim 14, in which the lightly-doped base region is formed with a depth not greater than the base region of increased doping concentration.

17. A method according to claim 8, in which:
 step (f) precedes steps (e) and (h) and includes forming the conductive contact of a semiconductive contact material; and
 the steps of introducing said impurity atoms include, successively, implanting impurity atoms of the second polarity into the substrate in the third area to form the base region of a width defined by the spacing of the contact portions; forming said layer of semiconductor contact material; implanting impurity atoms of the second polarity in the semiconductive contact material; diffusing the second polarity atoms therefrom into the substrate to a first depth and a first width substantially determined by a width of the emitter contact at the main face to define a base region of increased doping concentration and reduced width; implanting impurity atoms of the first polarity in the semiconductive contact material; and diffusing the first polarity atoms therefrom into the substrate to a second depth and a second width less than the first depth and first width, respectively, to define an emitter region within the base region of increased doping concentration.

18. A method according to claim 8, in which the step of providing said substrate includes forming a buried layer containing impurity atoms of said first polarity on a region of a semiconductor wafer and depositing on the wafer an epitaxial layer of said semiconductor material containing impurity atoms of said first polarity, the buried layer having a concentration of impurity atoms greater than the concentration in the epitaxial layer.

19. A method according to claim 1 including forming a second MOSFET on a third portion of the main face of the substrate in accordance with steps (a) through (h) but with carriers of opposite polarity, wherein:
   step (a) includes a substep of selectively doping a substrate region underlying the third portion of the main face upon which the second MOSFET is formed with impurity atoms that provide carriers of the second polarity;
   step (c) includes a substep of selectively introducing impurity atoms of the first polarity into the substrate region of the second MOSFET to form a lightly-doped drain region in the second MOSFET, the gate structure of the second MOSFET being effective to mask the region immediately subjacent the gate structure from the impurity atoms; and
   step (e) includes a substep of selectively introducing atoms of the first polarity into the substrate region of the second MOSFET by way of the first and second areas of the third portion of the main face which are exposed adjacent said sidewalls to form heavily doped source and drain regions of the first polarity in the second MOSFET.

20. A method of fabricating a mixed process integrated circuit including a bipolar transistor and a metal-oxide-semiconductor field-effect transistor (MOSFET), comprising the following steps:
   (a) providing a substrate of semiconductor material having a main face and containing first impurity atoms that provide charge carriers of a first polarity;
   (b) forming and patterning a first layer of semiconductive material to provide:
      (i) an elongate insulated gate structure on a first portion of the main face of the substrate, first and second areas of the main face being exposed along first and second opposite sides respectively of the gate structure, said substrate having drain and source regions bounded respectively by said first and second areas of the main face and containing impurity atoms that provide charge carriers of a second polarity, opposite the first polarity, and
      (ii) a base contact structure on a second portion of the substrate's main face, in contact with the semiconductor material, including first and second base contact portions having opposed third and fourth sides spaced apart about a third exposed area of the main face, the substrate having a base region underlying the third area containing impurity atoms of the second polarity;
   (c) forming a second layer of semiconductive material in contact with the semiconductor material of the substrate over said first, second and third areas of the main face and in contact therewith and over the gate and base contact structures and insulated therefrom;
   (d) forming a layer of a selected material over the layer of semiconductive material, said layer of selected material having a free surface that is substantially parallel to the main face of the substrate and through which said layer of semiconductive material is exposed; and
   (e) anisotropically removing the semiconductive material of said second layer, but not said selected material, in a direction that is substantially perpendicular to the main face of the substrate so as to expose the gate structure and form two discrete source and drain contacts overlying said first and second areas, and a discrete emitter contact overlying said third area, respectively, of the main face whereby fabrication of operative bipolar and MOSFET devices on a common substrate can be completed with only said first and second layers of semiconductive material.

21. A method according to claim 20 including forming an insulative box structure with top and sidewalls enclosing the gate and base contact structures and spacing the source and drain contacts from the gate structure and the emitter contact from the base contact structure.

22. A method according to claim 20, wherein the layer of semiconductive material formed in step (c) is polysilicon doped with atoms of the selected impurity.

23. A method according to claim 22 in which the polysilicon is selectively doped by ion implantation to a first depth and then atoms are diffused therefrom into the substrate to a predetermined depth to provide said charge carriers of second polarity.

24. A method according to claim 23 including forming a metal silicide on an upper surface of the polysilicon.

25. A method according to claim 20, wherein the layer of semiconductive material formed in the third area in step (c) is successively doped with impurity atoms of both the first and second polarities.

26. A method according to claim 25 in which the impurity atoms of the second polarity in the third area are diffused to a first depth and a first width substantially determined by a width of the emitter contact at the main face to define a base region.

27. A method according to claim 25 in which the impurity atoms of the first polarity are diffused to a second depth and a second width less than the first depth and first width, respectively, to define an emitter region.

28. A method according to claim 20 including, before forming the layer of semiconductor material, successively implanting impurity atoms of the second polarity into the substrate in the third area to form a base region of a first dopant concentration and a width determined by the spacing of the base contact portions and forming an insulative box structure with top and sidewalls enclosing the gate and base contact structures for spacing the source and drain contacts from the gate structure and the emitter contact from the base contact structure.

29. A method according to claim 28 including implanting impurity atoms of the second polarity into the semiconductive material in the third area and diffusing the second polarity atoms therefrom into the substrate to a first depth and a first width substantially determined by a width of the emitter contact at the main face to define a base region of increased doping concentration and reduced width; and implanting impurity atoms of the first polarity in the semiconductive material and diffusing the first polarity atoms therefrom into the substrate to a second depth and a second width less than the first depth and first width, respectively, to define an emitter region within the base region of increased doping concentration.

30. A method according to claim 8 including selectively shielding the semiconductive material over the third area during the anisotropic removal step.

31. A method according to claim 20 including forming a second MOSFET on a third portion of the main face in accordance with steps (a) through (e) but with carriers of opposite polarity, wherein:
  step (a) includes a substep of selectively doping a substrate region underlying the third portion of the main face upon which the second MOSFET is formed with impurity atoms that provide carriers of the second polarity; and
  step (b) includes forming and patterning the first layer of semiconductive material so as to further provide:
    (iii) an elongate insulated second gate structure on the third portion of the main face of the substrate, first and second areas of the third portion of the main face being exposed along first and second opposite sides respectively of the second gate structure, said substrate having drain and source regions bounded respectively by said first and second areas of the main face and containing impurity atoms that provide charge carriers of a first polarity.

32. A method of fabricating a mixed process integrated circuit including a metal-oxide semiconductor field-effect transistor and a bipolar transistor on a common substrate, comprising the following steps, steps (f) and (g) not necessarily being in the order stated:
  (a) providing a substrate of semiconductor material having a main face and containing impurity atoms that provide charge carriers of a first polarity;
  (b) forming an elongate insulated gate structure of a predetermined height on a first portion of the substrate's main face for the metal-oxide silicon field effect transistor, and first and second areas of the main face being exposed along first and second opposite sides respectively of the gate structure;
  (c) forming a base contact structure on a second portion of the substrate's main face for the bipolar transistor, in contact with the semiconductor material, including first and second base contact portions having opposed third and fourth sides spaced apart about a third exposed area of the main face;
  (d) introducing impurity atoms that provide charge carriers of a second polarity, opposite the first polarity, into the substrate by way of said first, second and third areas of the main face, the gate structure and base contact structure being effective to mask the regions of the substrate immediately subjacent the structures from the impurity atoms;
  (e) forming a sidewall of a material that is opaque to atoms of a selected impurity along said first and second sides of the gate structure, and along said third and fourth sides of the base contact, whereby a strip of the main face along each said side of the gate structure and base contact structure is covered by the sidewall but other parts of the first, second and third areas of the main face remain exposed;
  (f) introducing atoms of the selected impurity into the substrate by way of those portions of the first, second and third areas which are exposed adjacent said sidewalls, the atoms of said selected impurity providing charge carriers of said second polarity; and
  (g) forming separate conductive source, drain and emitter contacts over said exposed portions of said first, second and third areas, respectively;
  the gate and base contact structures of steps (b) and (c) being formed simultaneously from a common first conductive layer and the conductive contacts of step (g) being formed simultaneously from a common second conductive layer.

33. A method according to claim 32, wherein the conductive contacts are formed of a semiconductive material, including implanting atoms of the selected impurity into semiconductive contact material and diffusing said atoms therefrom into the substrate to provide said charge carriers of second polarity in the first, second and third areas, and thereby form a base in the third area.

34. A method according to claim 33, including implanting impurity atoms of the first polarity into the contact material on the third area and diffusing said atoms therefrom to form an emitter in the third area.

35. A method according to claim 32, including controlling step (d) so as to produce a lightly-doped base region of a first width in the third area and controlling step (f) so as to produce a base region of increased doping concentration and a width less than the first width by an amount proportioned to a thickness of the sidewall on the base contact portions.

36. A method according to claim 35, wherein the base contact structure is formed of a semiconductive material, including implanting atoms of the selected impurity into semiconductive base contact material and diffusing said atoms therefrom into the substrate to provide said charge carriers of second polarity in the substrate subjacent the base contact and spaced from the base region of increased doping concentration by a margin of the lightly-doped base region.

37. A method according to claim 35 in which the lightly-doped base region is formed with a depth not greater than the base region of increased doping concentration.

38. A method according to claim 35 in which the lightly-doped base region and the first and second areas are simultaneously doped to approximately the same depth and doping concentration.

39. A method according to claim 35 in which the lightly-doped base region and the first and second areas are doped to different doping concentrations or profiles.

40. A method according to claim 32 in which the conductive contacts are formed by selectively enclosing the gate and base contact structures in a dielectric material defining said sidewalls while leaving the first, second and third areas exposed, depositing a layer of semiconductive material selectively over the enclosed gate and base structures and the exposed first, second and third areas, and selectively dividing the portions of the semiconductor material overlying the gate structures into separate source and drain contacts.

41. A method according to claim 40, including selectively shielding the conductive material in the third area from removal, thereby to form a discrete emitter contact overlying said third area.

42. A method according to claim 40 including, before enclosing the base contact structure in said dielectric material, successively implanting impurity atoms of the second polarity into the substrate in the third area to form a base region of a first dopant concentration and a width determined by the spacing of the base contact portions; depositing and dividing said layer of semiconductor material to form said source and drain contacts and an emitter contact in the third area; implanting impurity atoms of the second polarity in the semiconductive material forms the emitter contact in the third area; diffusing the second polarity atoms therefrom into the substrate to a first depth and a first width substantially determined by a width of the emitter contact at the main face to define a base region of increased doping concentration and reduced width; implanting impurity atoms of the first polarity in the semiconductive material; and diffusing the first polarity atoms therefrom into the substrate to a second depth and a second width less than the first depth and first width, respectively, to define an emitter region within the base region of increased doping concentration.

43. A method of fabricating a mixed process integrated circuit including a metal-oxide semiconductor field-effect transistor and a bipolar transistor on a common substrate, comprising the following steps, steps (f) and (g) not necessarily being in the order stated:
(a) providing a substrate of semiconductor material having a main face and containing impurity atoms that provide charge carriers of a selected polarity;
(b) forming an elongate insulated gate structure of a predetermined height on a first portion of the main face of the substrate for the metal-oxide silicon field effect transistor, and first and second areas of the main face being exposed along first and second opposite sides respectively of the gate structure;
(c) forming a base contact structure on a second portion of the substrate's main face for the bipolar transistor in contact with the semiconductor material, including first and second base contact portions having opposed third and fourth sides spaced apart about a third exposed area of the main face;
(d) introducing impurity atoms that provide charge carriers of a polarity opposite the selected polarity, into the substrate by way of said first, second and third areas of the main face, the gate structure and base contact structure being effective to mask the regions of the substrate immediately subjacent the structures from the impurity atoms;
(e) forming a sidewall of a material that is opaque to atoms of a selected impurity along said first and second sides of the gate structure, and along said third and fourth sides of the base contact, whereby a strip of the main face along each said side of the gate structure and base contact structure is covered by the sidewall but other parts of the first, second and third areas of the main face remain exposed;
(f) introducing atoms of the selected impurity into the substrate by way of those portions of the first, second and third areas which are exposed adjacent said sidewalls, the atoms of said selected impurity providing charge carriers of said opposite polarity; and
(g) forming separate conductive source, drain and emitter contacts over said exposed portions of said first, second and third areas, respectively;
the gate and base contact structures of steps (b) and (c) being formed simultaneously from a common first conductive layer and the conductive contacts of step (g) being formed simultaneously from a common second conductive layer.

* * * * *

UNITED STATES PATENT AND TRADEMARK OFFICE
CERTIFICATE OF CORRECTION

PATENT NO. : 4,902,640

DATED : February 20, 1990

INVENTOR(S) : Jack Sachitano, Hee Kyun Park, Paul K. Boyer, Gregory C. Eiden and Tadanori Yamaguchi It is certified that error appears in the above-identified patent and that said Letters Patent is hereby corrected as shown below:

In the Claims:

Column 14, line 68, reads "(h)" should be --(f)--.

Signed and Sealed this

Twenty-sixth Day of February, 1991

*Attest:*

HARRY F. MANBECK, JR.

*Attesting Officer*      *Commissioner of Patents and Trademarks*